United States Patent
Iancu

(10) Patent No.: US 7,236,480 B2
(45) Date of Patent: Jun. 26, 2007

(54) METHOD OF FIRST INTERLEAVING OF A TWO INTERLEAVER TRANSMITTER

(75) Inventor: Daniel Iancu, Pleasantville, NY (US)

(73) Assignee: Sandbridge Technologies, Inc., White Plains, NY (US)

(*) Notice: Subject to any disclaimer, the term of this patent is extended or adjusted under 35 U.S.C. 154(b) by 1058 days.

(21) Appl. No.: 10/163,346

(22) Filed: Jun. 7, 2002

(65) Prior Publication Data

US 2003/0227885 A1    Dec. 11, 2003

(51) Int. Cl.
*H04B 7/216*    (2006.01)
*H03M 13/00*    (2006.01)

(52) U.S. Cl. .............. 370/335; 370/342; 370/320; 714/752

(58) Field of Classification Search ........ 370/335–356, 370/441–474; 375/140–141, 240–260; 714/701–746, 714/751–779
See application file for complete search history.

(56) References Cited

U.S. PATENT DOCUMENTS

| | | | |
|---|---|---|---|
| 5,754,783 A | 5/1998 | Mendelson et al. | |
| 5,889,791 A * | 3/1999 | Yang | 714/752 |
| 6,041,393 A | 3/2000 | Hsu | |
| 6,205,190 B1 | 3/2001 | Antonio et al. | |
| 6,351,456 B1 | 2/2002 | Struhsaker et al. | |
| 6,732,316 B1 * | 5/2004 | Tong et al. | 714/756 |
| 6,744,744 B1 * | 6/2004 | Tong et al. | 370/320 |
| 6,842,871 B2 * | 1/2005 | Piret et al. | 714/701 |
| 6,859,497 B2 * | 2/2005 | Duquesnois | 375/240.26 |
| 6,868,514 B2 * | 3/2005 | Kubo et al. | 714/755 |
| 6,876,623 B1 * | 4/2005 | Lou et al. | 370/208 |
| 7,003,703 B2 * | 2/2006 | Chun | 714/701 |
| 2003/0079170 A1 * | 4/2003 | Stewart et al. | 714/755 |
| 2003/0120995 A1 * | 6/2003 | Kim et al. | 714/786 |
| 2003/0133446 A1 * | 7/2003 | Schoenblum | 370/356 |
| 2003/0177430 A1 * | 9/2003 | Piret | 714/751 |
| 2004/0057401 A1 * | 3/2004 | Dick et al. | 370/329 |
| 2004/0125765 A1 * | 7/2004 | Yun et al. | 370/328 |
| 2004/0146029 A1 * | 7/2004 | Tong et al. | 370/335 |

* cited by examiner

*Primary Examiner*—Man U. Phan
(74) *Attorney, Agent, or Firm*—Barnes & Thornburg LLP

(57) ABSTRACT

The present invention involves padding the bit sequence in the first interleaver. The present method adds to an end of the bit sequence a sufficient number of padding bits L to permit modulus 16 operation of the bit sequence. After performing the interleaving, L bits are removed from an end of the interleaved sequence. This allows the interleaving to be performed in 16-bit segments simultaneously.

11 Claims, 2 Drawing Sheets

METHOD OF FIRST INTERLEAVING OF A TWO INTERLEAVER TRANSMITTER

BACKGROUND AND SUMMARY OF THE INVENTION

The present invention relates generally to communication systems of coded data and, more specifically, to an improvement in the first interleaver of a two interleaver transmitter.

Although the present invention will be described with respect to code division multiple access (CDMA) system, the same method can be used on other interleavers in other systems. General and specific references will also be made to the CDMA standard 3GPP TS 25.212: "Multiplexing and channel coding (FDD)".

Interleaving is an important function specific to the most digital communication protocols. It provides the means to undermine the burst noise that frequently affects the quality of reception in the digital communication systems as discussed by K. S. Andrews, C. Heegard, and D. Kozen in *A Theory of Interleavers*, Technical Report TR97-1634, Department of Computer Science, June 1997; and Chris Heegard and Stephen B. Wicker in *Turbo Coding*, Kluwer Academic Publishers, 2000.

Bit wise block interleavers represent a tremendous challenge for programmable micro-computing machines. An efficient software implementation for the interleavers offers multiple advantages, such as re-programmability, power and computation efficiency, fast development time, and eliminating the need for dedicated hardware block.

Specific to CDMA communication protocol, the first block interleaver function deals with block sizes containing a variable number of bits depending on the propagation conditions. Although padding bits in the second interleaver followed by pruning is common, there is no discussion of padding bits in the first interleaver.

The present invention involves padding the bit sequence in the first interleaver. The present method adds to an end of the bit sequence a sufficient number of padded bits L to permit modulus 16 operation of the bit sequence. After performing the interleaving, L bits are removed from an end of the interleaved sequence. This allows the interleaving to be performed in 16-bit segments simultaneously.

The adding can include adding randomly alternating zero and one bits. The number of L bits is determined by:

$$L=16-\text{Mod}_{16}(X_i)$$

where, $\text{Mod}_{16}$ represent modulus sixteen operation, and $X_i$ is the input bit sequence.

The method applies to any block size and executes 16 bits or multiples of 16 bits interleaving at once. The interleaving is performed in software and without forming a matrix of the bit sequence. The toll paid is a small number of errors introduced by this method. The errors are corrected at the receiver by the forward error correcting (FEC) function.

These and other aspects of the present invention will become apparent from the following detailed description of the invention, when considered in conjunction with accompanying drawings.

DETAILED DESCRIPTION OF THE PREFERRED EMBODIMENTS

Figure 1:
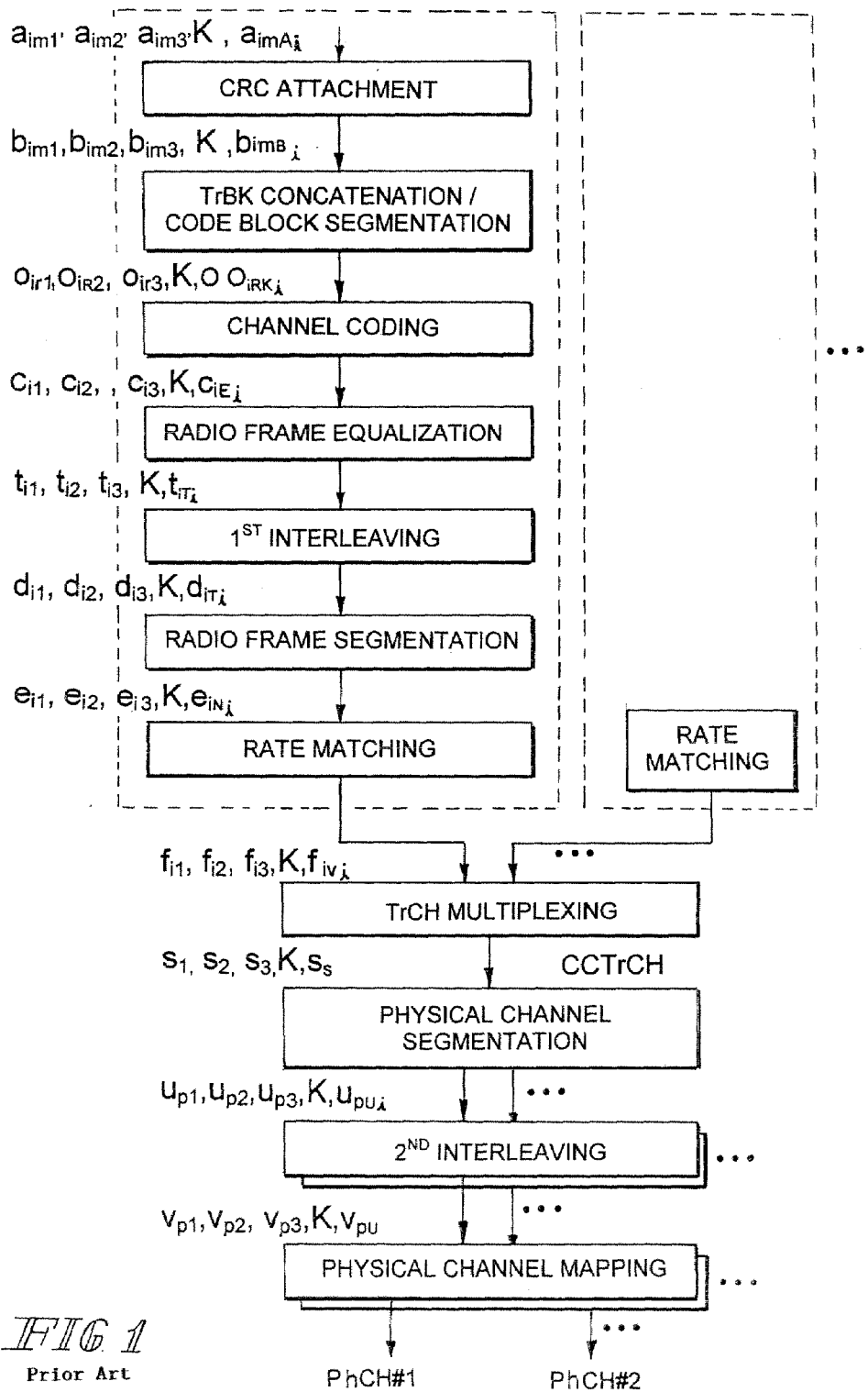
FIG. 1 is a block diagram of a general multiplexing structure of the prior art.

A typical receiver is shown in FIG. 1. A cycle redundant check (CRC) processes the bit sequence a and produces the bit sequence b. A transport block (TrBk) concatenation and code block segmentation is performed after signal coding producing sequences c and o, respectively. Radio frame equalization produces sequence t. There is a first interleaver whose output d is processed by radio frame segmentation and rate matching producing sequences e and f, respectively. Next, transport channel (TrCH) multiplexing produces a sequence s, which is a coded composite transport channel (CCTrCH). Next, physical channel segmentation produces sequence u, which is transmitted through a second interleaver to produce sequence v. Finally, physical channel mapping is performed to produce physical channels PhCH.

A method for the first interleaver suitable for efficient software implementation is presented. The method takes advantage of the integer unit of the micro-computing machine by performing 16-bit interleaving at once. The interleaving is performed in software and without forming a matrix of the bit sequence. By employing this method, a small error, inverse proportional with the number of interleaved bits will be introduced. At the receiver end, the errors will be corrected by the FEC (Forward Error Correction) unit.

Figure 2:
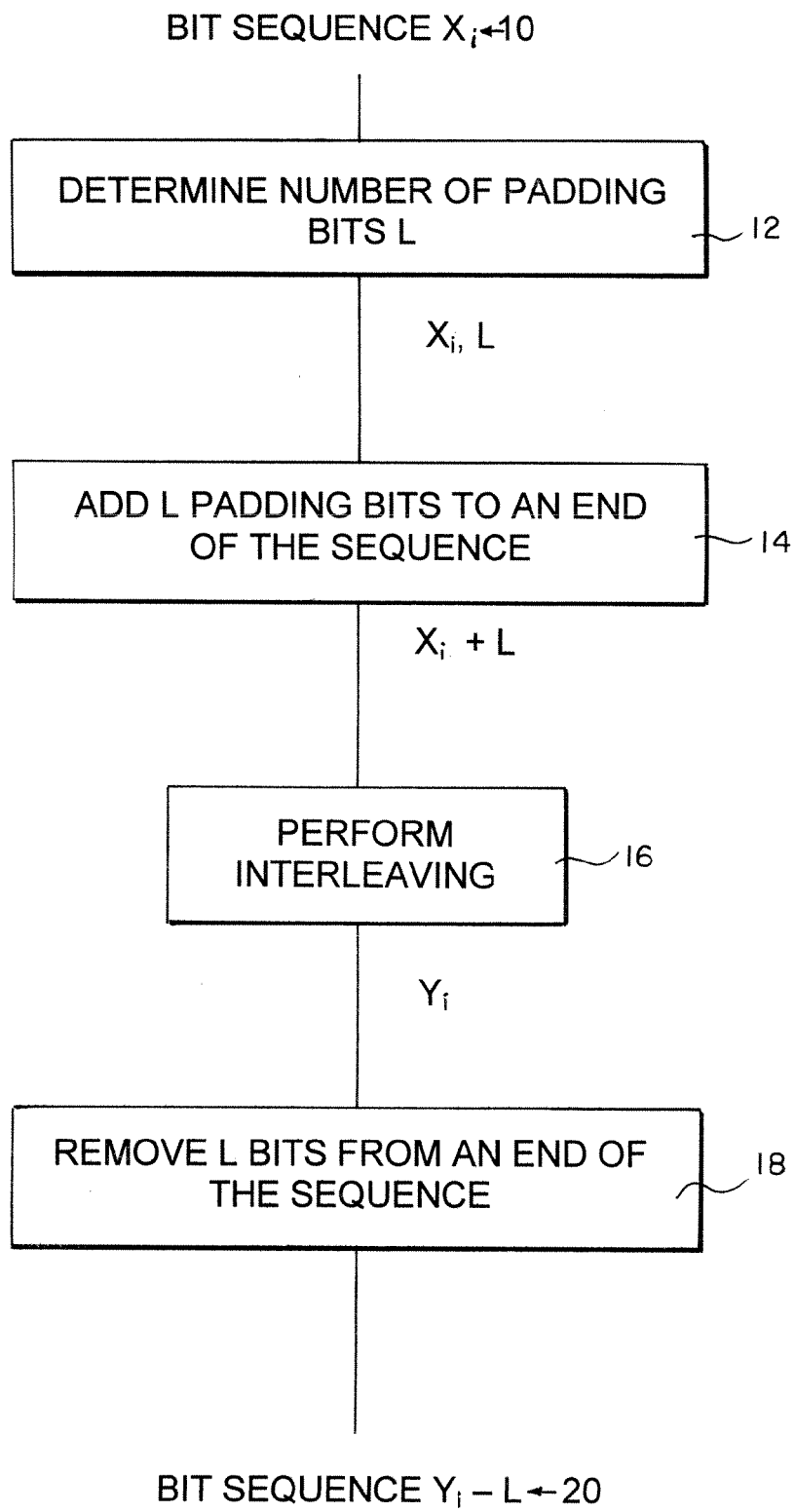
FIG. 2 is a flow chart of a method of first interleaving incorporating the principles of the present invention.

The method, as illustrated in FIG. 2, begins with the bit sequence $X_i$ at input 10. First, a determination of the number of padding bits to be added to the sequence $X_i$ must be made at 12. The number of bits L to be added brings the total sequence to a number of bits which is divisible by 16 without a remainder. For example, if the bit sequence $X_i$ is 324 bits, the remainder is 4 when 324 is divided by 16. Thus, the number of padded bits is 12 or 16 minus 4.

Next, L padding bits are added to an end of the bit sequence at 14 to produce a bit sequence $X_i$+L. Next, interleaving is performed on the padded sequence at 16 and produces sequence $Y_i$. Next, L bits are removed from an end of the sequence $Y_i$ at 18. The resulting output bit sequence is $Y_i$-L at 20. The sequence is farther processed through the flow chart of FIG. 1 and transmitted.

It should be noted that the L bits may be added at the beginning or the end of the sequence to $X_i$, and L number bits may be removed from either end. The removed bits may be at the same or at a different end of the sequence, as was added to $X_i$. This makes no difference in that the results are the same. There is no attempt to prune the added bits from the interleave sequence $Y_i$ at the exact location of the padded bits. Pruning would remove the bits in the interleave sequence $Y_i$ where they occurred after interleaving. This takes time and requires shuffling of the data bit sequence to make it continuous and, therefore, is wasteful in time and calculations.

The maximum number of padding bits L is 15. Thus, in the worst case, there will be 15 erroneous bits in the output bit sequence $Y_i$-L. Because of the interleaving process moving the padded bits from one end of the bit sequence to different positions throughout the bit sequence, it is very unlikely that all padding bits will be left in the interleave sequence after L bits are removed. The padded bits are preferably random alternating zero and one bits, which reduces the possible number of incorrect bits. All zero or all one bits may also be used as the padded bits. Statistically, 8 of the 15 would probably be incorrect.

The number of padding bits L may be expressed or determined by the following formula:

$$L = 16 - Mod_{16}(X_i)$$

where, $Mod_{16}$ represent modulus sixteen operation, and $X_i$ is the input bit, sequence.

By employing this method, a small error, inverse proportional with the number of interleaved bits will be introduced. At the receiver end, the errors will be corrected by the FEC (Forward Error Correction) unit.

Interleaver operation of step 16 may be that as described in the CDMA standard 3GPP TS 25.212: "Multiplexing and channel coding (FDD)" as follows:

The input bit sequence to the block interleaver is denoted by $x_{i,1}, x_{i,2}, x_{i,3}, \ldots, x_{i,X_i}$, where i is the transport channel TrCH number, and $X_i$ is the number of bits. Here, $X_i$ is guaranteed to be an integer multiple of the number of radio frames in the TTI. The output bit sequence from the block interleaver is derived as follows:

(1) Select the number of columns C1 from table 4 depending on the TTI. The columns are numbered 0, 1, . . . , C1-1 from left to right.

(2) Determine the number of rows of the matrix, R1 defined as:

$$R1 = X_i / C1.$$

The rows of the matrix are numbered 0, 1, . . . , R1-1 from top to bottom.

(3) Write the input bit sequence into the R1×C1 matrix row by row starting with bit $x_{i,1}$ in column 0 of row 0 and ending with bit $X_{i,(R1 \times C1)}$ in column C1-1 of row R1-1:

$$\begin{bmatrix} x_{i,1} & x_{i,2} & x_{i,3} & \cdots & x_{i,C1} \\ x_{i,(C1+1)} & x_{i,(C1+2)} & x_{i,(C1+3)} & \cdots & x_{i,(2 \times C1)} \\ \vdots & \vdots & \vdots & \cdots & \vdots \\ x_{i,((R1-1) \times C1+1)} & x_{i,((R1-1) \times C1+2)} & x_{i,((R1-1) \times C1+3)} & \cdots & x_{i,(R1 \times C1)} \end{bmatrix}$$

(4) Perform the inter-column permutation for the matrix based on the pattern $\{P1_{C1}(j)\}_{j \in \{0, 1, \ldots, C1-1\}}$ shown in table 1, where $P1_{C1}(j)$ is the original column position of the j-th permuted column. After permutation of the columns, the bits are denoted by $y_{i,k}$:

$$\begin{bmatrix} y_{i,1} & y_{i,(R1+1)} & y_{i,(2 \times R1+1)} & \cdots & y_{i,((C1-1) \times R1+1)} \\ y_{i,2} & y_{i,(R1+2)} & y_{i,(2 \times R1+2)} & \cdots & y_{i,((C1-1) \times R1+2)} \\ \vdots & \vdots & \vdots & \cdots & \vdots \\ y_{i,R1} & y_{i,(2 \times R1)} & y_{i,(3 \times R1)} & \cdots & y_{i,(C1 \times R1)} \end{bmatrix}$$

(5) Read the output bit sequence $Y_{i,1}, Y_{i,2}, Y_{i,3}, \ldots, Y_{i,(C1 \times R1)}$ of the block interleaver column by column from the inter-column permuted R1×C1 matrix. Bit $Y_{i,1}$ corresponds to row 0 of column 0 and bit $Y_{i,(R1 \times C1)}$ corresponds to row R1-1 of column C1-1.

TABLE 1

Inter-column permutation patterns for 1st interleaving

| TTI | Number of columns C1 | Inter-column permutation patterns <$P1_{C1}(0), P1_{C1}(1), \ldots, P1_{C1}(C1-1)$> |
|---|---|---|
| 10 ms | 1 | <0> |
| 20 ms | 2 | <0, 1> |
| 40 ms | 4 | <0, 2, 1, 3> |
| 80 ms | 8 | <0, 4, 2, 6, 1, 5, 3, 7> |

In summary, the present method for the first interleaver is suitable for efficient software implementation. The method takes advantage of the integer unit of the micro-computing machine by performing 16-bit interleaving at once. By employing this method, a small error, inverse proportional with the number of interleaved bits will be introduced. At the receiver end, the errors will be corrected by the FEC unit.

Although the present invention has been described and illustrated in detail, it is to be clearly understood that this is done by way of illustration and example only and is not to be taken by way of limitation. The spirit and scope of the present invention are to be limited only by the terms of the appended claims.

What is claimed:

1. A method of interleaving of a first interleaver of a two interleaver forward error correction transmitter, the method comprising:
    prior to the first interleaving of a sequence of bits, adding to an end of the bit sequence a sufficient number L of padding bits to permit modulus sixteen operation of the bit sequence;
    performing the first interleaving of the bit sequence;
    removing L bits from an end of the interleaved bit sequence; and
    providing the interleaved bit sequence to a second interleaver of the transmitter.

2. The method of claim 1, including performing the interleaving in 16-bit segments simultaneously.

3. The method of claim 1, wherein the adding includes adding randomly alternating zero and one bits.

4. A method of interleaving of a first interleaver of a two interleaver forward error correction transmitter, the method comprising:
    prior to interleaving a sequence of bits, adding to an end of the bit sequence a sufficient number L of padding bits to permit modulus sixteen operation of the bit sequence;
    performing interleaving of the bit sequence; and
    removing L bits from an end of the interleaved bit sequence, wherein the number L, as determined by:

$$L = 16 - Mod_{16}(X_i)$$

where, $Mod_{16}$ represent modulus sixteen operation, and $X_i$ is the input bit sequence.

5. The method of claim 1, the L bits are added and removed from the same end of the sequence.

6. The method of claim 1, the L bits are added and removed from opposite ends of the sequence.

7. The method of claim 1, wherein the interleaving is performed in software.

8. The method of claim 1, wherein the method is performed without forming a matrix of the bit sequence.

9. An apparatus including an interleaver or deinterleaver performing the method of claim 1.

10. The apparatus of claim 9, wherein the apparatus includes software for performing the method of claim 1.

11. The apparatus of claim 9, wherein the method of claim 1 is performed in the apparatus without forming a matrix of the bit sequence.

* * * * *